US009368887B2

(12) United States Patent
Ekstedt et al.

(10) Patent No.: US 9,368,887 B2
(45) Date of Patent: Jun. 14, 2016

(54) ARRANGEMENT FOR CONNECTING A PLUGGABLE TRANSCEIVER

(71) Applicant: Telefonaktiebolaget L M Ericsson (publ), Stockholm (SE)

(72) Inventors: Ulf Ekstedt, Saltsjöbaden (SE); Michael Lindahl, Rönninge (SE); Hong Tang, Järfälla (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 211 days.

(21) Appl. No.: 14/296,780

(22) Filed: Jun. 5, 2014

(65) Prior Publication Data

US 2014/0360769 A1 Dec. 11, 2014

(30) Foreign Application Priority Data

Jun. 11, 2013 (EP) .................................... 13171442

(51) Int. Cl.
| | |
|---|---|
| H05K 7/00 | (2006.01) |
| H01R 12/70 | (2011.01) |
| H05K 1/11 | (2006.01) |
| G02B 6/42 | (2006.01) |

(52) U.S. Cl.
CPC .............. *H01R 12/70* (2013.01); *G02B 6/4246* (2013.01); *G02B 6/4261* (2013.01); *G02B 6/4284* (2013.01); *G02B 6/4292* (2013.01); *H05K 1/11* (2013.01)

(58) Field of Classification Search
USPC ............... 361/728, 679.01; 439/345; 174/261
See application file for complete search history.

(56) References Cited

U.S. PATENT DOCUMENTS

| | | | |
|---|---|---|---|
| 4,659,163 A | 4/1987 | Althouse et al. | |
| 6,135,793 A | 10/2000 | Babineau | |
| 6,304,436 B1 | 10/2001 | Branch et al. | |
| 7,869,224 B1 | 1/2011 | Yang | |
| 2004/0005803 A1* | 1/2004 | Stockhaus | H01R 13/6272 439/345 |
| 2005/0195565 A1 | 9/2005 | Bright | |
| 2009/0016685 A1* | 1/2009 | Hudgins | H04B 10/40 385/92 |

OTHER PUBLICATIONS

Communication with European Search Report, EP Application No. 13171442.0, Jan. 7, 2014.
SFF Committee, "SFF-8432 Specification for Improved Pluggable Formfactor", Rev 5.1, Aug. 8, 2012, 17 pp.
SFF Committee, "INF-8074i Specification for SFP (Small Formfactor Pluggable) Transceiver", Rev 1.0, May 12, 2001, 38 pp.

* cited by examiner

*Primary Examiner* — Andargie M Aychillhum
(74) *Attorney, Agent, or Firm* — Myers Bigel & Sibley, P.A.

(57) ABSTRACT

An apparatus including a socket forming at least one compartment together with a printed circuit board assembly. The compartment including a first side wall, a second side wall, a ceiling, and an opening for receiving one pluggable transceiver, such that when the pluggable transceiver is inserted into the opening, a transceiver contact of the pluggable transceiver is connected to a respective board contact of the printed circuit board assembly. A clamping means is arranged along at least one surface of: the first side wall, the second side wall and the ceiling, to exert a pressure on the pluggable transceiver towards a surface that is opposed the surface on which the clamping means is arranged. The opposed being one of: the second side wall, the first side wall, and the printed circuit board assembly, when the pluggable transceiver is inserted into the opening.

13 Claims, 5 Drawing Sheets

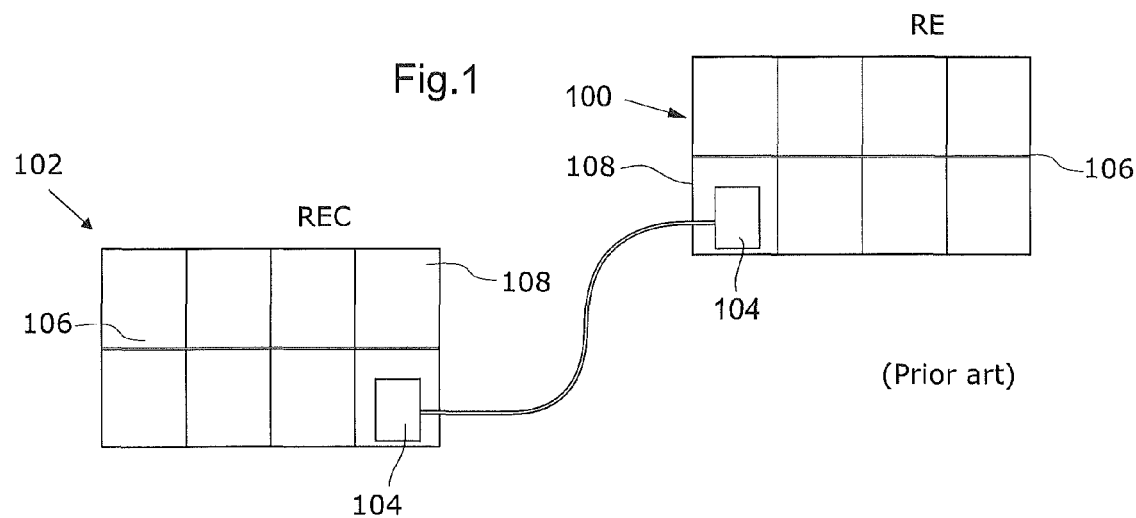
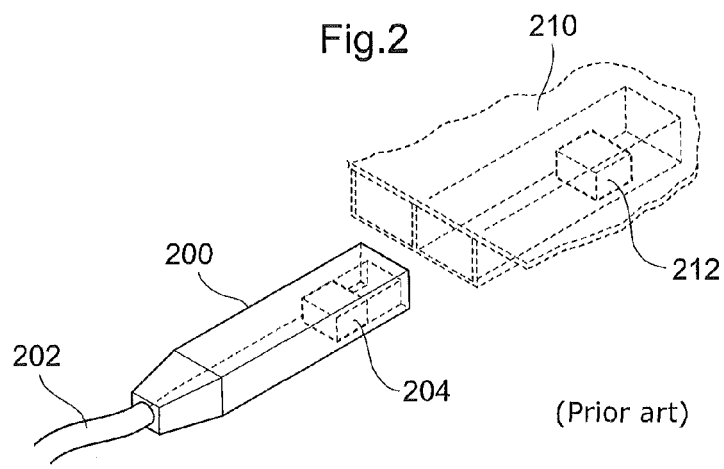
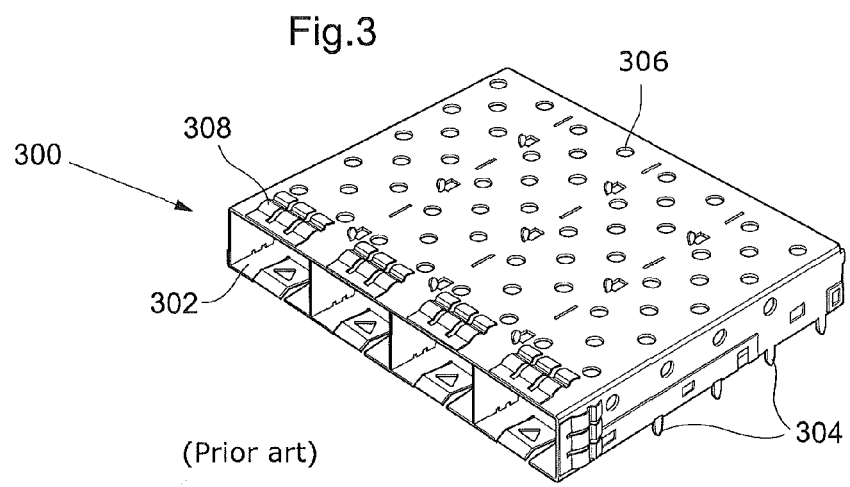

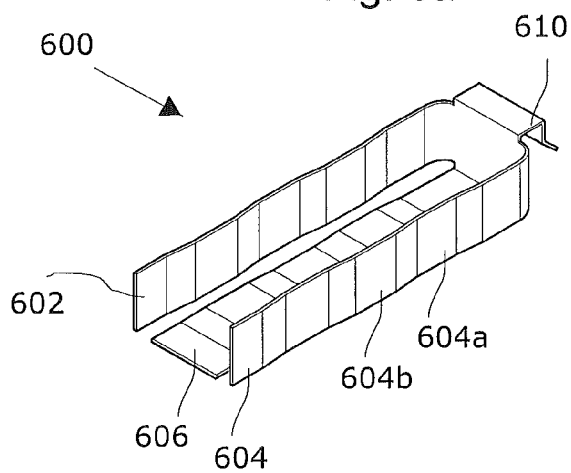
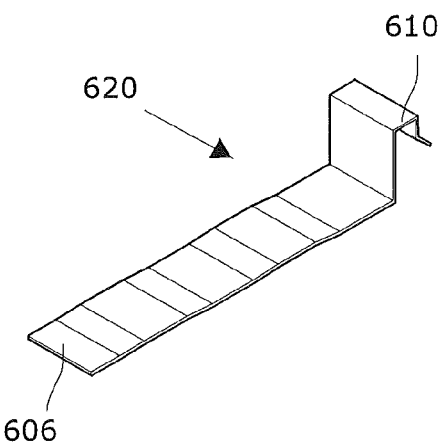
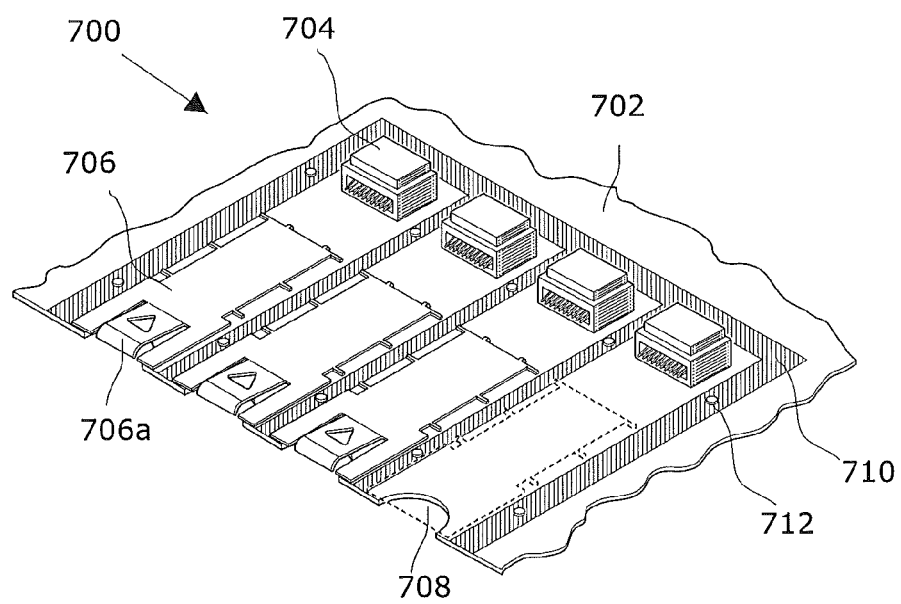

ARRANGEMENT FOR CONNECTING A PLUGGABLE TRANSCEIVER

CROSS REFERENCE TO RELATED APPLICATION

This application claims priority to European Patent Application No. 13171442.0, filed Jun. 11, 2013, the disclosure and content of which is incorporated herein by reference in its entirety as if set forth fully herein.

TECHNICAL FIELD

The present disclosure relates generally to an arrangement for connecting communication devices, especially for connecting SFP (Small Formfactor Pluggable) transceivers to communication network devices.

BACKGROUND

In communication networks various communication network devices are connected to each other in order to exchange communication data. Typically, when exchanging data, data rates are relatively high, e.g. above 1 Gb/s, and optoelectronic cables are therefore used. Pluggable transceivers, e.g. SFPs, are commonly applied to convert the electrical signals into optical signals, and vice versa. However, there exist also pluggable transceivers which communicate data with other pluggable transceivers as electrical signals. Typically, these kind of pluggable transceivers transform outgoing electrical signals into other electrical signals of another format to be conveyed via communication cables.

In this description "pluggable transceiver" will be used to denote any suitable pluggable transceiver for connecting a transmission cable to a communication device. For instance, the pluggable transceivers could be implemented as: SFP transceivers, defined in SFF-8074i (Small FormFactor); Improved Small Pluggable Formfactor transceivers or SFP+ transceivers, defined in SFF-8432; QSFP (Quad Small Pluggable Formfactor) transceivers, XFP (10 Gigabit Small Form Factor Pluggable), or CFP (C Formfactor pluggable)

With reference to FIG. 1, which is a schematic overview, a situation where SFPs are exchanging data will now be described according to an example.

Two communication network devices 100, 102 are arranged to exchange data. In this example the communication network devices 100, 102 are implemented as an RE (Radio Equipment) and a REC (Radio Equipment Control) arranged within a Radio Base Station. However, SFPs may be used in a plurality of different communication scenarios, for instance at routers or other communication network devices which communicate data at high data rates. Each communication network device 100, 102 comprise a printed circuit board 106 to which SFPs 104 will be connected. Both the SFPs 104 and the printed circuit boards 106 have electrical contacts arranged thereupon to connect the SFPs 104 to the printed circuit boards 106. On the printed circuit boards 106 cages 108 are arranged to receive the SFPs 104 and fixate the contacts of the SFPs 104 to the contacts of the printed circuit boards 106, when the SFPs are inserted into respective compartments of the cages 108.

Cages are commonly provided with different numbers of compartments where each compartment is arranged to receive one SFP, e.g. a cage could be provided with 1, 2, 4, or 8 compartments, etc. In order to shield the SFPs electrically and prevent the SFPs from being affected by electromagnetic interference from their surroundings, the cages are generally made of metal. For instance, in radio base stations, there are communication network devices arranged which emit radio magnetic radiation and give rise to electromagnetic interference. The cages are therefore arranged to protect as well the SFPs from being affected by disturbing electromagnetic radiation from surrounding communication devices, as for protecting the surrounding communication devices from being affected by the SFPs.

Within this description the term "printed circuit board assembly" will be used to define a printed circuit board comprising a cage mounted thereon.

FIG. 2 is a schematic illustration of an SFP 200 and a transmission cable 202, according to an example. The SFP 200 is arranged to receive communication data from a transmitting communication network device (not shown) via the transmission cable 202, and input the communication data into a receiving communication network device 210 (illustrated with dotted lines). The SFP 200 will therefore be connected via a transceiver contact 204 to a matching board contact 212 of the receiving communication network device 210. Typically, the board contact 212 is located in a cave of a printed circuit board assembly of the communication network device.

When cages are mounted on a printed circuit board, they are commonly manually placed on the printed circuit board before being attached to the printed circuit board, e.g. by soldering, wiring, or glueing.

FIG. 3 is a schematic illustration of a cage commonly used today. The cage 300 in this example comprises four compartments 302, and each compartment 302 is arranged to receive one respective pluggable transceiver, when the cage 300 is attached to a printed circuit board and operating. In order to enable the cage 300 to be mounted on a printed circuit board there are a plurality of pins 304 arranged on the cage 300, where the pins 304 fit into corresponding holes of the printed circuit board. When mounting the cage 300 on the printed circuit board, an assembler places the cage 300 onto the printed circuit board before the pins 304 are soldered to the printed circuit board. In order to achieve proper fastening of the cage 300, there may be a large number of pins 304 arranged. To achieve efficient production of cages 300, the pins 300 are commonly designed from the same working piece as the cage 300. In general, the cages 300 are placed manually on the printed circuit board and due to the large amount of pins there is a risk for damaging the pins 302 when mounting, e.g. the pins may be bent, which may result in deterioration of attachment or shielding properties.

Furthermore, operating SFPs generate excesses heat, which in a narrow space of the cage could deteriorate operating conditions of the SFPs.

In order to achieve reliable working temperature of the pluggable transceivers, excessive heat will be removed, and cages are generally provided with ventilating holes 306, which are punched or drilled in the material of the cages.

When printed circuit board assemblies are arranged in communication network devices, the cages are inserted through holes in a bezel or a clam shell. In order to fixate the cages to he bezels/clam shells, the cages are commonly provided with resilient tabs 308.

A typical process for manufacturing the cage 300 according to the described example is to punch out five parts of a working peace: an upper part, a bottom part, and three intermediate compartment walls. Furthermore, the process comprises to punch ventilation holes 306, resilient tabs 308, and means for fixating the parts to each other. Commonly, such means for fixating is implemented as further tabs of the working peace which will be folded when assembling the parts. In this example, the upper part is folded to form two side walls of the cage 300. Finally, the parts are assembled into the resulting cage 300, e.g. by folding the further tabs, or by soldering, etc., which could then be mounted on a printed circuit board.

Thus, there are many operational and assembling steps to be performed when constructing cages, where some of the steps cause risk for damaging small parts of the working peaces. Damaged parts may give rise to deterioration of electro magnetic compability (EMC) or improper fastening. Cages which do not fulfil EMC properties may have to be discarded and replaced, which could be causes additional costs.

With reference to FIG. 4, which is a schematic overview, the steps for mounting a printed circuit board assembly will now be described according to an example.

A printed circuit board assembly 400 is to be inserted in a so called clam shell 410. In this example, the printed circuit board assembly 400 comprises a printed circuit board 404 and a cage 402 mounted thereon. The opening of the cage 402 will be introduced through a corresponding hole 412 in the clam shell 410 when the printed circuit board assembly 400 is mounted in the clam shell 410. To enable the printed circuit board assembly 400 to be mounted into the clam shell 410, the clam shell 410 will typically require an additional internal space, such that the printed circuit board assembly first is immersed into the clam shell 410, before being pushed towards the hole 412 of the clam shell 410.

As indicated above, there is a risk for damaging parts of the cages when mounting the cages into clam shell 410, e.g. the mounting tabs 308. Damaged parts may achieve that the printed circuit board assemblies do not operate properly, or that the cages will not shield electromagnetic radiation properly. In environments where pluggable transceivers are applied, the requirements for EMC are commonly strict, since the communication network devices as well as the pluggable transceivers emit electromagnetic radiation and may affect each other.

Thus, there is a need for a robust connection arrangement for pluggable transceiver, which is able to produce efficiently.

SUMMARY

It would be desirable to obtain improved performance in communication network devices. It is an object of this disclosure to address at least some of the issues outlined above.

Further, it is an object to provide a mechanism for improving electromagnetic compliance when connecting communication network devices. These objects may be met by arrangement according to the attached independent claims.

According to one aspect, an arrangement is provided for connecting at least one pluggable transceiver to a communication network device. The arrangement comprises a socket arranged to form at least one compartment together with a printed circuit board assembly when the socket is mounted on the printed circuit board assembly. The compartment comprises a first side wall, a second side wall, a ceiling, and an opening for receiving the pluggable transceiver, such that when the pluggable transceivers is inserted into the opening, a transceiver contact of the pluggable transceiver is connected to a respective board contact of the printed circuit board assembly. Further, the arrangement comprises a clamping means arranged along at least one surface of: the first side wall, the second side wall and the ceiling, such that the clamping means exerts a pressure on the pluggable transceiver towards a surface that is opposed the surface on which the clamping means is arranged, said opposed surface being one of: the second side wall, the first side wall, and the printed circuit board assembly, when the pluggable transceiver is inserted into the opening.

Furthermore, the clamping means may comprise clamping means arranged substantially alongside both side the side walls to exert the pressure on the pluggable transceiver towards the respective opposed side walls. The clamping means may further comprise a top clamping member arranged substantially alongside the ceiling to exert the pressure towards the printed board assembly. Each clamping means may comprise a corrugated portion comprising bulges arranged such that at least one bulge abuts the socket and at least one bulge abuts the pluggable transceiver, when inserted into the opening.

According to another aspect a printed circuit board assembly is provided, which comprises a printed circuit board, at least one first board contact arranged on a first surface of the printed circuit board, and at least one first board spring arranged on the first surface. The printed circuit board assembly is arranged to be mounted on the socket of the arrangement according to the first aspect, such that the printed circuit board assembly forms a bottom of the compartment with the first board contact located inside the compartment, when the socket is mounted on the printed circuit board assembly.

By providing an arrangement and a printed circuit board according to the described aspects, electromagnetic compliance for pluggable transceivers may be increased and excess heat from the pluggable transceivers may be effectively removed. In addition, with a limited amount of assertion steps, a robust and appropriate arrangement may be achieved.

BRIEF DESCRIPTION OF DRAWINGS

The solution will now be described in more detail by means of exemplary embodiments and with reference to the accompanying drawings, in which:

FIG. 1 is a schematic environmental illustration of an arrangement, according to the prior art.

FIG. 2 is a schematic illustration of an SFP, according to the prior art.

FIG. 3 is a schematic illustration of a cage, according to the prior art.

FIGS. 6a-b are schematic illustrations of clamping means, according to possible embodiments.

FIG. 7 is schematic illustration of a printed circuit board assembly, according to possible embodiments.

DESCRIPTION

Figure 4:
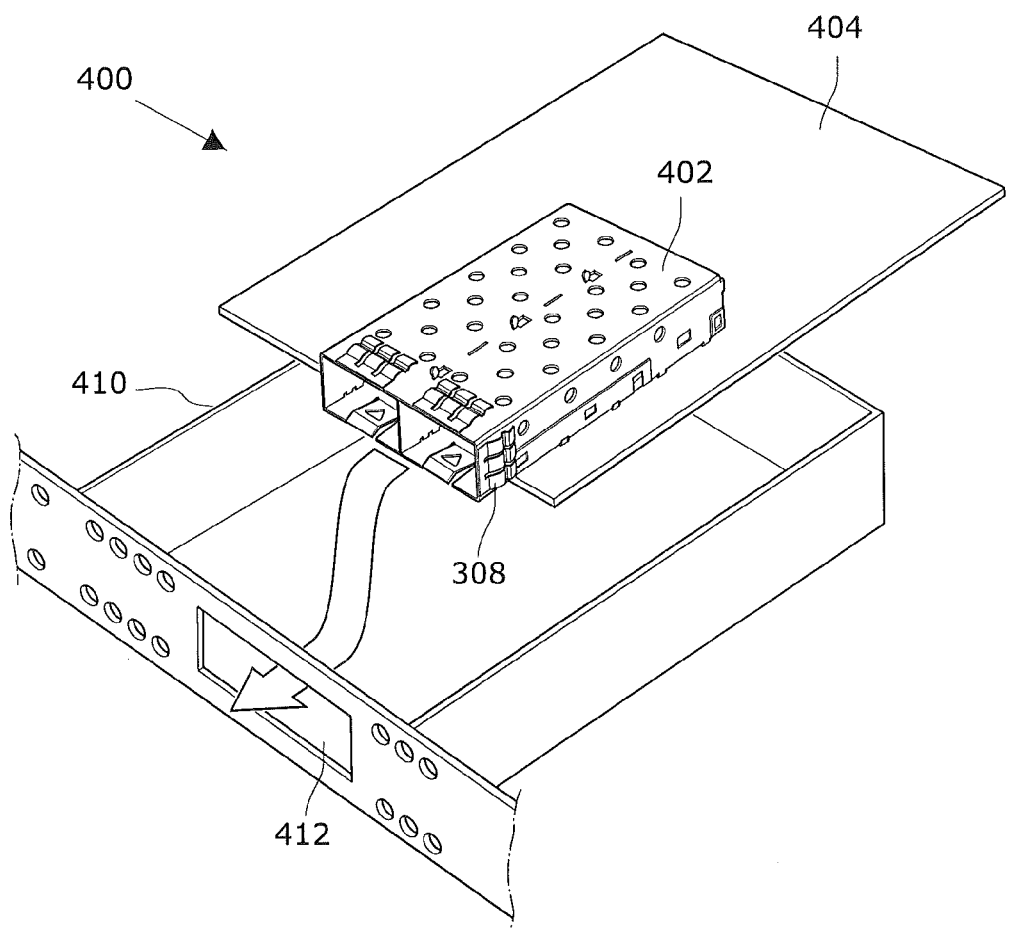
FIG. 4 is a schematic illustration of an arrangement in a communication network device, according to the prior art.
Figure 5A:
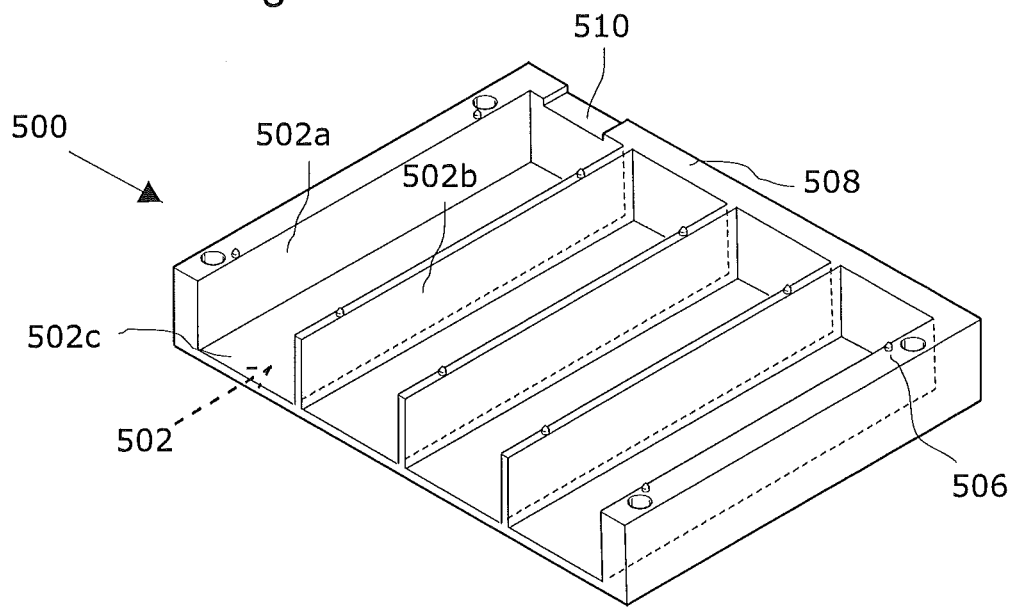
FIGS. 5a-b are schematic illustrations of sockets, according to possible embodiments.
Figure 5B:
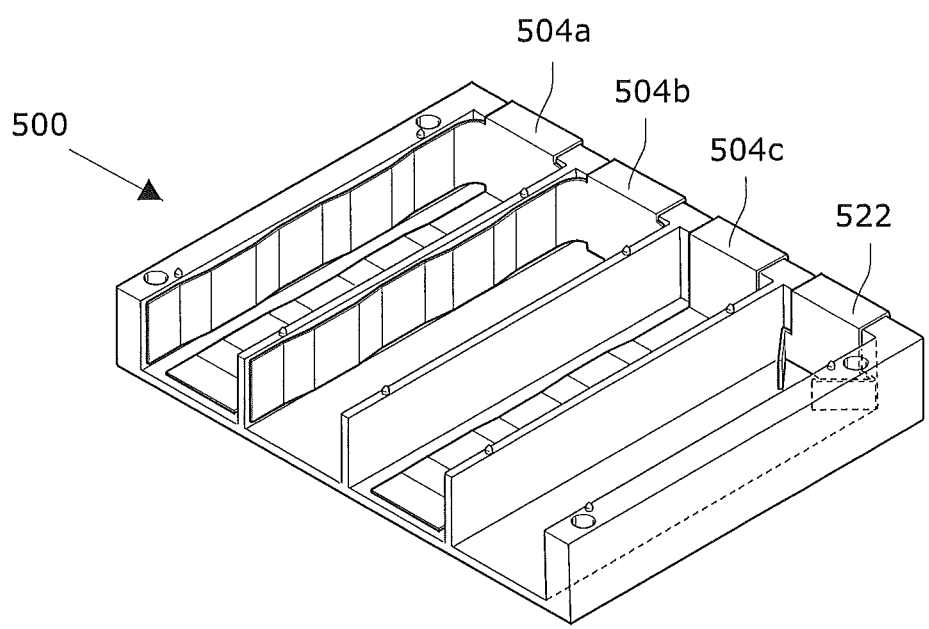

With reference to FIGS. 5a and 5b, which are schematic illustration views, an arrangement for connecting pluggable transceivers will now be described in accordance with one exemplifying embodiment.

The arrangement comprises a socket 500 and clamping means 504a, 504b, 504c. In this exemplifying embodiment, the socket 500 is provided with four trays 502, where each tray 502 is arranged to form a respective compartment when the socket 500 is mounted on a printed circuit board assembly (not shown). The clamping means 504a, 504b, 504c are arranged substantially within the trays 502, such that when a pluggable transceiver, e.g. SFP, SFP+, QSFP, etc., is inserted in a compartment, the clamping means 504a, 504b, 504c fixates the pluggable transceiver within the compartments. In this exemplifying embodiment, the clamping means 504a is arranged along a first side wall 502a, a second side wall 502b (hidden), as well as a ceiling 502c of the tray 502. Thereby, the clamping means 504a exerts a pressure on the pluggable transceiver towards the second side wall 502b, the first side wall 502a, as well as the printed circuit board assembly, when the socket is mounted on the printed circuit board assembly and the pluggable transceiver is inserted into the compartment.

The socket will typically be constructed of a metal or a metal alloy which shields the pluggable transceivers electrically from the surrounding environment. In this exemplifying embodiment, the socket is constructed of a metal alloy AlSilMgMn, where Al stands for Aluminium, Sil for Silver, Mg for Manganese, and Mn for Magnesium.

Thereby, the pluggable transceivers will be prevented from affecting the other devices in the environment, and the pluggable transceivers may in addition be protected from surrounding electromagnetic radiation, which may result in more reliable operation conditions.

Typically, the socket 500 may be manufactured by first moulding the socket and then milling the side walls of the socket. Thereby, a cost effective manufacturing process is achieved, which requires few manufacturing steps and results in a design of the socket with appropriate measurement tolerances.

In another exemplifying embodiment, which is based on the exemplifying embodiment described above, the socket 500 is provided with guiding means 506, implemented as pins which are arranged to fit into matching guiding means of the printed circuit board assembly.

The trays 502 may further be provided with back walls 508. The back walls 508 may shield the pluggable transceivers further from surrounding electromagnetic radiation, in order to fulfil requirements for electromagnetic compliance (EMC) of the arrangements. In addition, the back walls 508 may be provided with recesses 510, which may be applied for fastening the clamping means to the trays 502, e.g. by pinching a tab of the clamping means 504a, 504b, 504c into the recesses 510.

When attaching the clamping means, a skilled person is not limited to apply the back walls of the trays. He/she may instead attach the clamping means 504a, 504b, 504c on any of the side walls. Furthermore, the skilled person realises that the clamping means does not necessarily have to be provided in one piece. He/she realises that the clamping members may be provided alternatively, e.g. as separate pieces, and understands how to attach them on appropriate side walls, or ceilings of the trays.

Even if the above described clamping means 504a comprises clamping members on three sides, the clamping means 504b, 504c may be implemented alternatively within the concept of this disclosure, as will be described further below.

As illustrated in the FIG. 5b, the clamping means 504b, 504c may be arranged differently. For instance the clamping means 504b may be designed to be arranged along the both side walls of the tray, or the clamping means 504c may be arranged along the ceiling of the tray 502. Furthermore, the socket 500 may be provided with a back spring 520, arranged at the back wall 504. The back spring 520 comprises two resilient tabs 522 arranged to exert a pressure on a pluggable transceiver towards the opening of the compartment when the pluggable transceiver is inserted into a compartment. It is also to be noted that the back spring 522 may exert a force on the SFP towards the opening, which may facilitate removal of the SFP, when appropriate.

Furthermore, the back spring 522 may be designed differently within the scope of this disclosure. For instance, the back spring 522 may be integrated with the clamping means 504a, 504b, 504c, the back spring 522 may comprise any suitable number of tabs, or the tabs may have different orientation in the trays.

By arranging the clamping means 504a, 504b, 504c substantially along the side walls and the ceiling of the trays, such that the clamping means abut the sides of the pluggable transceivers, as well as the side walls and the ceiling of the trays, the clamping means will exert a pressure force on the pluggable transceiver, which fixates a respective receiver contact of the pluggable transceiver in relation to a respective board contact of a printed board assembly. Thereby, abrasion of the contact surfaces will be minimized. Furthermore, by manufacturing the clamping means of a heat conducting material, such as an alloy comprising Nickel and Silver, excess heat originating from the pluggable transceivers may be carried away from the pluggable transceivers, which results in better operating conditions. Moreover, in order to shield from electromagnetic radiation and leading excess heat away, the socket is manufactured of a material comprising Aluminium, such as an AlSilMgMn alloy which is an alloy comprising Aluminium, Silver, Manganese, and Magnesium.

For illustrative purposes and in order to facilitate understanding of the principle solution, the socket is illustrated as a separate unit, which will be mounted on a printed circuit board assembly. However, the scope of the present disclosure is not limited thereto, and a designer will be free to implement the socket differently, when put into practice. For instance he/she may integrate the socket within a surrounding frame, e.g. as a clam shell, to be inserted in a communication network device, or provide the socket with a different number of trays.

With reference to FIGS. 6a and 6b, which are schematic perspective illustrations, two clamping means will now be described in accordance with two exemplifying embodiments.

The clamping means 600 illustrated in FIG. 6a is adapted to be arranged in a tray of a socket, as disclosed above in other exemplifying embodiments. The clamping means 600 comprises three clamping members 602, 604, 606, which will be arranged along a respective first side wall, a second side wall and a ceiling of a tray in a socket. The clamping members 602, 604, 606 are arranged to press the pluggable transceiver towards the second side wall, the first side wall, and the printed circuit board assembly.

However, the clamping means may be designed alternatively, as already discussed above. For instance, in one alternative exemplifying embodiment, the clamping means 620 comprises a ceiling clamping member 606 arranged substantially along the ceiling of the socket, in order to press the pluggable transceiver towards the printed board assembly. As described, above, the clamping means are manufactured of an alloy comprising Nickel and Silver. However, a skilled person is not limited thereto, and may select alternative suitable materials which have resilient and conductive properties within the described scope, e.g. other metals or metal alloys.

In both the exemplifying embodiments described in accordance with reference to FIGS. 6a and 6b, the clamping members 602, 604, 606 are provided with corrugated portions, respectively. The corrugated portions in these exemplifying embodiments are implemented as bulges 604a, 604b, which alternately abut the sides of the SFP and the side walls or ceiling along which the clamping members are arranged. In order to illustrate the characteristics that the clamping members exert pressure on the SFP, the corrugated portions are illustrated with sharp lines between the bulges 604a, 604b. However, the concept is not limited thereto, and a designer realises that alternative designs may be provided, e.g. clamping members 604a, 604b may have a sinusoidal curved form, etc.

Providing the clamping members 602, 604, 606 with corrugated portions is beneficial from a plurality of perspectives, e.g. the clamping members fixates the SFPs in the compartments which decreases assertion of the board contacts as well as of the transceiver contacts. The clamping members lead excess heat away from the SFPs which achieves better operating conditions of the SFPs, and the design of the clamping members prevents standing waves within the compartment, etc.

In two alternative embodiments, which are based on some embodiments described above, the clamping means 600, 620 are provided with a tab 610 which will be pinched over a back wall of trays to fastening the clamping means 600, 620, e.g. through a recess designed in the back wall. However, it is to be noted that that the fastening means may be implemented alternatively within the present scope. For instance, the clamping means 600, 620 may be soldered or welded to the back wall. The outermost parts of the clamping members 602, 604, 606 may further be bent outwards to facilitate reception of the SFPs when inserted.

Furthermore, a plurality of clamping means 600, 620, may be integrated in one and the same component, such that a clamping means arrangement is provided which comprises one clamping means per tray, and the clamping means are joined together outside the trays. For instance, the tabs 610 may be joined together.

With reference to FIG. 7, which is a schematic illustration, a printed circuit board assembly will be described in accordance with one exemplifying embodiment.

The printed circuit board assembly 700 is arranged to have a socket mounted on one of its surfaces. As already described above in another exemplifying embodiment, the socket and the printed circuit board will then constitute an arrangement with a plurality of compartments for receiving and connecting pluggable transceivers. The printed circuit board assembly 700 comprises a printed circuit board 702, four contacts 704, and four board springs 706.

The printed circuit board 702 is adapted to be arranged in a communication network device and is further adapted to connect pluggable transceivers for exchanging communication data with other communication network devices. The board contacts are arranged on an upper surface of the printed circuit board 702 to connect with corresponding receiver contacts of the pluggable transceivers. The board springs 706 are arranged on the printed circuit board 702 in order to exert a pressure on the pluggable transceiver, when inserted in the corresponding compartments. Thereby, the pluggable transceiver will be pressed towards respective ceilings of the socket, as described above in accordance with another exemplifying embodiment.

In an alternative exemplifying embodiment, which is based on the one described above, the printed circuit board 702 is further provided with an electrical conducting pattern 710, arranged to connect the socket walls electrically to the printed circuit board 702. By arranging the conducting pattern 710, the side walls of the sockets will connect electrically to the printed circuit board assembly, and the compartments may therefore be shielded from surrounding electromagnetic interferences. The printed circuit board 702 may further be provided with guiding means 712 to simplify mounting of sockets in a correct position on the printed circuit board 702. As disclosed above, the guiding means may be implemented as a plurality of holes in the printed circuit board, in order to receive corresponding guiding pins which are arranged on the socket.

Moreover, the board springs 706 may be provided with release tabs 706a, which will fix the pluggable transceivers in their respective compartments when inserted. The release tabs 706a may further be pressed against the printed circuit board 702 to enable the pluggable transceivers to be released from the compartments. In order to enable the release tabs 706 to be pressed, the printed circuit board 702 may be provided with recesses 708. Correspondingly, as for the clamping members of the clamping means, the board springs may be provided with corrugated portions with bulges which abuts the pluggable transceivers.

In another alternative exemplifying embodiment, which is based on the some of the above described exemplifying embodiments, the printed circuit board 702 may further be provided with board contacts 704 and board springs 706 also on a second surface. Thereby, sockets may be mounted on both sides of the printed circuit board, which enables further pluggable transceivers to be connected to the printed circuit board assembly 700. The other surface of the printed circuit board may also be provided with corresponding conducting pattern 710, and guiding means 712.

Even if the sockets 500 and printed circuit board assemblies 700 according to the above described exemplifying embodiments are arranged to form four compartments each, the concept is not limited thereto. A skilled person understands how modify the printed circuit board assemblies to form a suitable number of compartments, e.g. 1, 2 or 8 compartments. Furthermore, he/she understands that the compartments may be integrated as in the figures, or be located with a distance between each other when appropriate, and is capable to amend the sockets 500 and circuit board assemblies accordingly.

In an alternative exemplifying embodiment, which is based on the above described one, the printed circuit board 700 is adapted to get a further socket mounted thereupon. The further socket will then be mounted on another surface of the printed circuit board, e.g. on the opposite side as the first socket. By providing board contact and board springs on both sides of the printed circuit board, a so called "Belly-to-Belly"-arrangement may be achieved, which may enable a further pluggable transceivers to be connected. In a similar way, as in some exemplifying embodiments described above, also the other surface may be provided with connecting patterns and guiding means.

Figure 8:
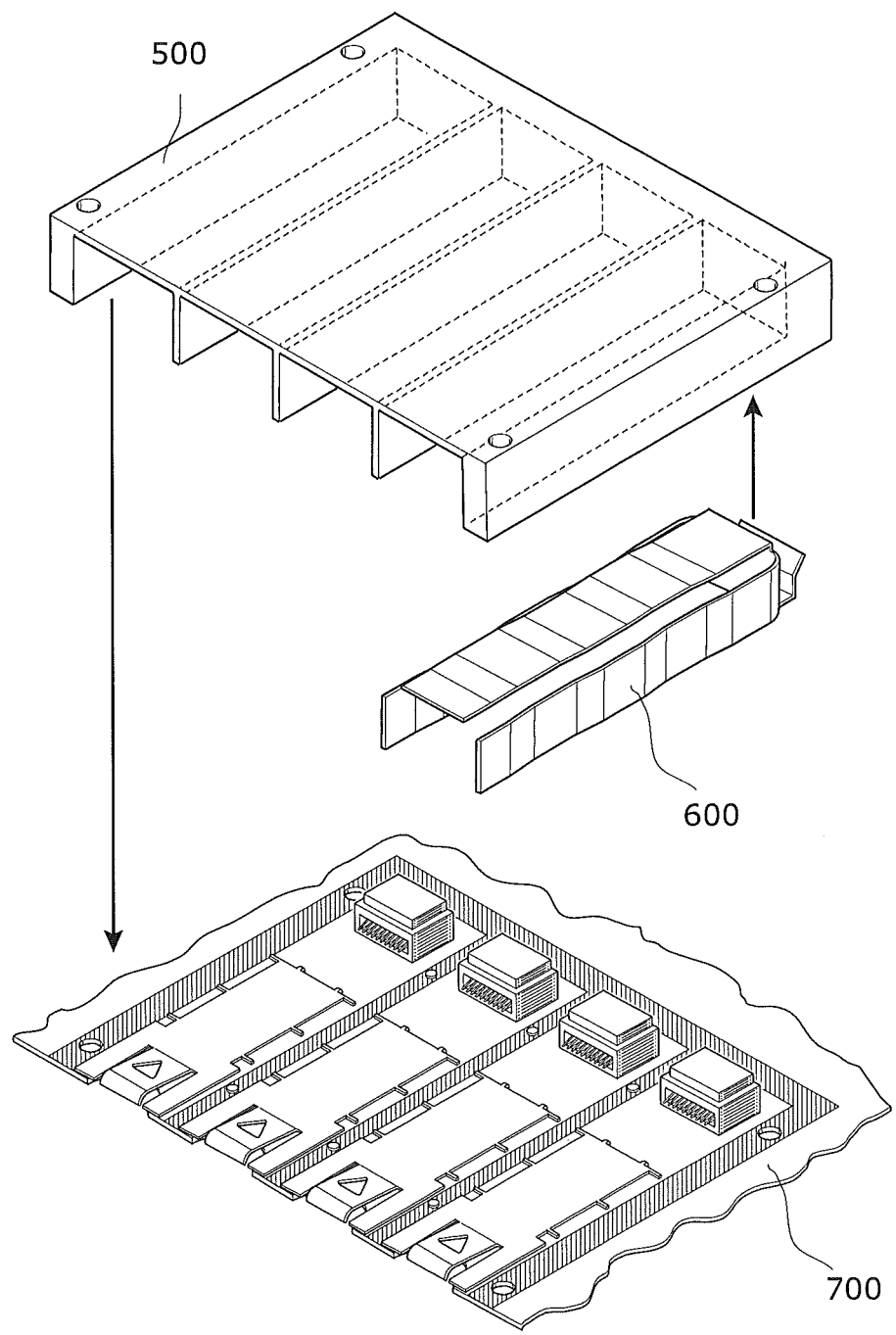
FIG. 8 is a schematic exploded view an arrangement, according to possible embodiments.

With reference to FIG. 8, which is a schematic exploded view, an arrangement used for connecting SFPs will now be described in accordance with one exemplifying embodiment.

The arrangement 800 comprises a socket 500, a plurality of clamping means 600, and a printed circuit board assembly 700. These components have been disclosed above in connection with other exemplifying embodiments and will therefore not be further specified. Therefore, the same reference numbers have also been applied.

The clamping means 600 is mounted in the socket 500, e.g. by pinching a tab (not referred to) over back walls of a respective tray. Then the socket, with mounted clamping means 600, is placed on the printed circuit board assembly 700, such that each tray forms a compartment together with a part of the printed circuit board 700, where each compartment comprising one board contact and one board spring. Typically, when asserting the arrangement, the socket 500 may be attached to the printed circuit board assembly 700 by screws or other suitable fastening means. The socket 500 as well as the printed circuit board assembly 700 may be provided with matching holes therefore (as seen in the figure).

Typically, the socket 500 will have a plurality of clamping means 600 arranged. However, for illustrative purposes and in order to facilitate the understanding, only one clamping means 600 is illustrated in the figure. As stated above in another exemplifying embodiment, the scope of the present disclosure is not limited to a specific number of compartments, and a skilled person realises how to amend the socket 500 and the printed circuit board assembly 700 to fit a suitable number of pluggable transceivers to be inserted. Moreover, within the scope of the present disclosure, he/she may design the socket 500 integrated with a surrounding frame, etc., as stated above in another exemplifying embodiment. Furthermore, he/she is capable to select a suitable number of clamping means 600 accordingly.

It is to be noted that even if the described socket in the above described exemplifying embodiments is provided with four trays, the concept is not limited thereto. A skilled person may select to provide any other suitable number of sockets when implementing, e.g. 1, 2, 8 sockets. It is also to be noted that even if the described exemplifying embodiments are described for Small Formfactor Pluggable transceivers, the concept is not limited thereto, and a designer may select to amend arrangement to fit any suitable pluggable transceiver, e.g. SFP+, QSFP, etc.

Reference throughout the specification to "one embodiment" or "an embodiment" is used to mean that a particular feature, structure or characteristic described in connection with an embodiment is included in at least one embodiment. Thus, the appearance of the expressions "in one embodiment" or "in an embodiment" in various places throughout the specification are not necessarily referring to the same embodiment. Further, the particular features, structures or characteristics may be combined in any suitable manner in one or several embodiments. Although the present invention has been described above with reference to specific embodiments, it is not intended to be limited to the specific form set forth herein. Rather, the invention is limited only by the accompanying claims and other embodiments than the specific above are equally possible within the scope of the appended claims. Moreover, it should be appreciated that the terms "comprise/comprises" or "include/includes", as used herein, do not exclude the presence of other elements or steps. Furthermore, although individual features may be included in different claims, these may possibly advantageously be combined, and the inclusion of different claims does not imply that a combination of features is not feasible and/or advantageous. In addition, singular references do not exclude a plurality. Finally, reference signs in the claims are provided merely as a clarifying example and should not be construed as limiting the scope of the claims in any way.

The scope is generally defined by the following independent claims. Exemplifying embodiments are defined by the dependent claims.

The invention claimed is:

1. An apparatus for connecting at least one pluggable transceiver to a communication network device, the apparatus comprising: a socket arranged to form at least one compartment together with a printed circuit board assembly when the socket is mounted on the printed circuit board assembly, where the compartment comprises a first side wall, a second side wall, a ceiling, and an opening for receiving the pluggable transceiver, such that when the pluggable transceiver is inserted into the opening, a transceiver contact of the pluggable transceiver is connected to a respective board contact of the printed circuit board assembly, and a clamping means arranged along at least one surface of: the first side wall, the second side wall and the ceiling, such that the clamping means exerts a pressure on the pluggable transceiver towards a surface that is opposed the surface on which the clamping means is arranged, said opposed surface being one of: the second side wall, the first side wall, and the printed circuit board assembly, when the pluggable transceiver is inserted into the opening, wherein the clamping means comprises a first clamping member arranged substantially alongside the first side wall to exert the pressure on the pluggable transceiver towards the second side wall, and a second clamping member arranged substantially alongside the second side wall to exert the pressure on the pluggable transceiver towards the first side wall.

2. The apparatus according to claim 1, wherein the clamping means comprises a top clamping member arranged substantially alongside the ceiling to exert the pressure on the pluggable transceiver towards the printed board assembly.

3. The apparatus according to claim 1, wherein at least one of the first clamping member, the second clamping member, and the top clamping member comprises a corrugated portion, the corrugated portion comprising two or more bulges arranged such that at least one of the bulges abuts the socket, and at least one other of the bulges abuts the pluggable transceiver, when the pluggable transceiver is inserted into the opening.

4. The apparatus according to claim 1, the socket further comprising a back wall and a back spring, the back spring being arranged onto the back wall to exert a pressure on the pluggable transceiver towards the opening.

5. The apparatus according to claim 1, wherein a recess is provided in at least one of the first side wall, the second side wall and the back wall, said recess being designed to receive one of the clamping means the first clamping member, the second clamping member, the top clamping member, and the back spring.

6. The apparatus according to claim 1, further comprising guiding means arranged on at least one of the first side wall, the second side wall, and the back wall, to guide the printed circuit board assembly into a fixed position when the printed circuit board is attached to the socket.

7. The apparatus according to claim 6, wherein the guiding means comprises pins arranged to be fitted into corresponding holes of the printed circuit board assembly.

8. The apparatus according to claim 1, wherein at least one of the clamping means comprises a Nickel Silver alloy, and the socket comprises an Aluminium alloy AlSilMgMn comprising Aluminium, Silver, Manganese, and Magnesium.

9. The apparatus according to claim 1, wherein the socket is integrated within a frame adapted to be inserted in the communication network device, wherein the frame is a clam shell.

10. A printed circuit board assembly comprising: a printed circuit board, at least one first board contact arranged on a first surface, of the printed circuit board, and at least one first board spring arranged on the first surface, wherein the printed circuit board assembly is arranged to be mounted on the socket of the apparatus according to claim 1, such that the printed circuit board assembly forms a bottom of the compartment with the first board contact located inside the compartment, when the socket is mounted on the printed circuit board assembly, wherein the at least one board spring is arranged such that the board spring exerts a pressure on the pluggable transceiver towards the ceiling, when the pluggable transceiver is inserted into the opening.

11. The printed circuit board assembly according to claim 10, further comprising at least one recess, arranged in the printed circuit board.

12. The printed circuit board assembly according to claim 10, further comprising guiding means arranged on at least one surface of the printed circuit board, to guide the printed circuit board assembly into a fixed position when the socket is mounted on the printed circuit board assembly.

13. The printed circuit board assembly according to claim 10, further comprising:
- at least one second board contact, and
- at least one second board spring,
- wherein the second board contact and the second board spring are arranged on a second surface of the printed circuit board assembly.

* * * * *